United States Patent [19]

Takenaka et al.

[11] 4,168,167
[45] Sep. 18, 1979

[54] PRESENSITIZED PRINTING PLATES FOR LITHOGRAPHIC PRINTING

[75] Inventors: Haruo Takenaka; Keisuke Shiba, both of Shizuoka; Kikuo Kubotera; Akira Kashiwabara, both of Asaka, all of Japan

[73] Assignee: Fuji Photo Film Co., Ltd., Minami-ashigara, Japan

[21] Appl. No.: 821,861

[22] Filed: Aug. 4, 1977

[30] Foreign Application Priority Data

Aug. 4, 1976 [JP] Japan .................................. 51-92873

[51] Int. Cl.[2] .......................... G03C 5/00; G03C 1/06; G03C 1/28
[52] U.S. Cl. ....................................... 96/35; 96/86 R; 96/95; 96/107; 96/66 R
[58] Field of Search .................... 96/86 R, 107, 35, 33, 96/95

[56] References Cited

U.S. PATENT DOCUMENTS

| | | | |
|---|---|---|---|
| 3,295,969 | 1/1967 | Abbott | 96/35 |
| 3,402,045 | 9/1968 | Woodward | 96/33 |
| 3,551,150 | 12/1970 | Woodward et al. | 96/86 R |
| 3,600,166 | 8/1971 | Sieg et al. | 96/86 R |
| 3,615,615 | 10/1971 | Lincoln et al. | 96/64 |
| 3,719,494 | 3/1973 | Kurtz et al. | 96/64 |
| 3,734,738 | 5/1973 | Kurtz et al. | 96/64 |
| 3,761,276 | 9/1973 | Evans | 96/108 |

*Primary Examiner*—Mary F. Kelley
*Attorney, Agent, or Firm*—Sughrue, Rothwell, Mion, Zinn and Macpeak

[57] ABSTRACT

Presensitized printing plates for lithographic printing which comprise an aluminum support having an anodically oxidized aluminum oxide film thereon and a light-sensitive layer containing internal latent image type silver halide grains which are not fogged on the anodically oxidized aluminum oxide film on the support.

23 Claims, No Drawings

PRESENSITIZED PRINTING PLATES FOR LITHOGRAPHIC PRINTING

BACKGROUND OF THE INVENTION

1. Field of the Invention

The present invention relates to printing materials utilizing the light sensitivity of silver halide and particularly to positive type printing materials which are presensitized (hereinafter called a presensitized printing plate).

2. Description of the Prior Art

Hitherto, positive type presensitized printing plates using silver halide emulsions have been known, for example, P.M.T. Process (trade name of Eastman Kodak), Mitsubishi Silver Master (trade name of Mitsubishi Paper Mills, Ltd.). However, the plate making process using such is complicated and the resulting printing plates have a low printing durability or a low ink receptivity. Although presensitized printing plates using direct positive type silver halide emulsions also are known as disclosed in U.S. Pat. No. 3,597,201 and Japanese Patent Application (OPI) No. 15502/74, the light sensitivity of these printing plates is low. According to the present invention, these defects have been eliminated.

SUMMARY OF THE INVENTION

A first object of the present invention is to provide presensitized printing plates having a high sensitivity sufficient to be capable of printing using an enlarged exposure of an original and having a high printing durability.

A second object of the present invention is to provide positive type presensitized printing plates which form printing images having a high ink receptivity by carrying out a series of simple processings comprising development and washing as main steps. These and other objects will become clear from the descriptions given in the present specification.

As a result of various investigations, it has now been found that the above-described objects are attained with a presensitized printing plate for lithographic printing which comprises an aluminum support having an anodically oxidized aluminum oxide film thereon and a light-sensitive layer containing internal latent image type silver halide grains which are not fogged on the support. A particularly preferred embodiment of this invention includes the presensitized printing plate described above containing additionally at least one of a tanning developing agent, a fogging agent (including also a precursor thereof) in the light-sensitive layer.

DETAILED DESCRIPTION OF THE INVENTION

It has been found that aluminum sheets having an anodically oxidized aluminum oxide film thereon having a thickness of about 0.1 to about 50μ or laminates comprising such an aluminum sheet and paper, a synthetic resin film or another metal sheet are preferred as the support used in the present invention.

The aluminum sheet for use in the present invention includes sheets of pure aluminum and of aluminum alloys. A variety of alloys can be used including those containing silicon, copper, manganese, magnesium, chromium, zinc, lead, bismuth, nickel, etc. Some representative examples of suitable alloy compositions are shown in the following table. In the table, the values given are percent by weight, with the remainder being aluminum.

| Alloy No. | Composition of Typical Aluminum Alloys | | | | | |
|---|---|---|---|---|---|---|
| | Si | Cu | Mn | Mg | Cr | Zn |
| 2S | 0.4 | — | — | 0.6 | — | — |
| 3S | — | — | 1.2 | — | — | — |
| 24S | — | 4.5 | 0.6 | 1.5 | — | — |
| 52S | — | — | — | 2.5 | 0.25 | — |
| 61S | 0.6 | 0.25 | — | 1.0 | 0.25 | — |
| 75S | — | 1.60 | — | 2.50 | 0.30 | 5.60 |

These compositions generally include, in addition, small amounts of Fe and Ti and negligible amounts of impurities not shown in the table.

The surface of an aluminum sheet is usually subjected to chemical cleaning such as a degreasing with solvents or alkaline agents, as described in detail in *KINZOKU HYOMEN GIJUTSU BINRAN (A Handbook on Metallic Surfaces)*, pp. 86–210, Nikkan Kogyo Shinbunsha, Tokyo (1969), for the purpose of exposing a clean surface free of grease, rust or dust which is usually present on the aluminum surface. Depending on the requirement, the surface is grained. Suitable graining methods which can be used include glass bead graining, ball graining, sand blasting, brush graining as described in Japanese Patent Application (OPI) No. 33411/73, electrolytic graining as described in Japanese Patent Application (OPI) No. 28123/73 and British Pat. No. 896,563, etc. Any of these methods can be employed, however, graining is not always necessary and a polished surface of aluminum can be used as the printing surface of an offset printing support, although a grained support for offset printing exhibits a better water retention, thus giving preferred printed materials. Further, following the graining operation, depending on the requirements, a treatment of the aluminum with an aluminum etching agent can be used in order to reduce background staining, as is set forth in Japanese Patent Application (OPI) No. 49501/73.

The anodically oxidized aluminum oxide layer can be provided using the processes described in, for example, U.S. Pat. Nos. 3,511,661 and 3,891,516 and Japanese Patent Publication 20922/76, etc. By providing the aluminum oxide layer, not only are the inherent photographic activities of aluminum (fogging action or desensitizing action, etc.) reduced but also increased adherence of the images to the support can be obtained.

More specifically, an anodically oxidized layer is formed on a surface conditioned aluminum plate. When an electric current is passed through the aluminum support immersed as cathode in a solution containing one or more acids selected from sulfuric acid, phosphoric acid, chromic acid, oxalic acid, sulfamic acid, benzenesulfonic acid, etc., an anodically oxidized coating is formed on the surface of the aluminum support.

Typical anodizing conditions, of course, depend on the composition of the electrolytic solution used and thus cannot be defined unequivocally. In general, suitable anodizing conditions are as follows: acid concentration: about 1 to 80% by weight; temperature of solution: about 5° to 70° C.; current density: about 0.5 to 60 amp/dm$^2$; voltage: about 1 to 100 volts; period of electrolysis: about 30 sec to 50 min. Suitable anodizing procedures are disclosed in, for example, U.S. Pat. Nos. 3,808,000, 3,181,461, 3,280,734 and 3,511,661. The following table summarizes suitable processing conditions in greater detail.

| Electrolytic Solution | Solution Concentration (%) | Temperature (°C.) | Current Density (A/dm$^2$) | Voltage (V) | Period (min) |
|---|---|---|---|---|---|
| Sulfuric Acid | 1–70 | 5–65 | 0.5–30 | 1–50 | 1–30 |
| Oxalic Acid | 1–20 | 20–60 | 0.5–20 | 10–70 | 5–40 |
| Phosphoric Acid | 2–60 | 20–60 | 0.5–20 | 10–60 | 1–30 |
| Chromic Acid | 2–30 | 30–60 | 0.5–10 | 10–60 | 1–50 |

A suitable pore size in the anodically oxidized layer can range from about 50 to about 1,000 Å, preferably 50 to 500 Å. For example, when sulfuric acid is used as the electrolyte, a pore size of about 50 to about 150 Å is obtained and when phosphoric acid is used, a pore size of about 300 to about 1,000 Å is obtained.

The internal latent image type emulsion used in the present invention is an emulsion having a pH ranging from about 4 to about 7.5 and containing silver hlaide grains which form latent images in the interior of the grains. Preferably, the internal latent image type emulsion conforms with the definition described in U.S. Pat. No. 3,761,276. The internal latent image type emulsion can be determined using the standard described in U.S. Pat. No. 3,761,276. Namely, after strips coated with an emulsion to be tested are exposed to light under the same conditions, they are each developed at 20° C. for 6 minutes using a Surface Developing Solution X as described below or an Internal Developing Solution Y as described and fixed thereafter.

| Surface Developing Solution X | | |
|---|---|---|
| Metol (p-methylaminophenol sulfate) | 2.5 | g |
| Ascorbic Acid | 10.0 | g |
| Borax | 35.0 | g |
| Potassium Bromide | 1.0 | g |
| Water to make | 1,000 | ml |
| Internal Developing Solution Y | | |
| Metol (p-methylaminophenol sulfate) | 2.0 | g |
| Hydroquinone | 8.0 | g |
| Sodium Sulfite (anhydrous) | 90 | g |
| Sodium Carbonate (monohydrate) | 52.5 | g |
| Potassium Bromide | 5.0 | g |
| Potassium Iodide | 0.5 | g |
| Water to make | 1,000 | ml |
| Fixing Solution | | |
| Sodium Thiosulfate | 150 | g |
| Sodium Sulfite | 10 | g |
| Water to make | 1,000 | ml |

When the maximum density $D_{max}$ obtained using Internal Developing Solution Y is at least two times the maximum density $D_{max}$ obtained using Surface Developing Solution X or when the sensitivity obtained using Internal Developing Solution Y is at least five times that obtained using Surface Developing Solution X, the emulsion is called an internal latent image type emulsion.

In the internal latent image type silver halide emulsions of the present invention, the surface sensitization thereof is controlled so as to provide a defect to crystals themselves. Chemical sensitization is carried out during the step of physical ripening. Different kinds of metal ions such as rhodium ion or iridium ion, metal ions of Group VIII of the Periodic Table, etc., are introduced into the interior of the crystals. A suitable amount of these metal ions ranges from about $10^{-10}$ to about $10^{-2}$ mol% based on Ag. Alternatively, the resulting crystals are exchanged using a silver salt with a different solubility product.

Suitable examples of silver salts having a different solubility product which can be exchanged are silver chloride, silver bromide, silver iodide or mixed silver halides thereof. In addition with these emulsions, it is possible to form positive images by fogging development.

Suitable silver halides which can be used in the internal latent image type silver halide emulsions in this invention include conventional light-sensitive silver halides, e.g., silver chloride, silver bromide, silver iodide or mixed silver halides thereof. These silver halides can be prepared using conventional techniques, e.g., a normal mixing method, a reverse mixing method, a controlled double jet method, a controlled triple jet method, etc. It is preferred for the average grain size of the silver halide to range from about $0.1\mu$ to about $5\mu$, and particularly $0.5\mu$ to $2\mu$. The silver halide grains may be spectrally sensitized with, e.g., a cyanine dye, a merocyanine dye, a rhodacyanine dye in an amount of $10^{-8}$ to $10^{-3}$ mol/AgX mol. Additives such as mercapto compounds or triazole compounds may be added to the emulsions.

The silver halide grains can be produced in a known binder such as gelatin, gelatin derivatives, polyvinylpyrrolidone, acrylamide polymers or cellulose derivatives, etc. Further, in the present invention, it is preferred to use polymers which are capable of being tanned by developing agents. Alkali impermeable water poorly soluble oleophilic resins described in, for example, Japanese patent application No. 71846/76 (corresponding to U.S. patent application Ser. No. 807,612, filed June 17, 1977) may be incorporated in the binder as finely divided particles, and applied in an amount of 0.1 g/m$^2$ to 10 g/m$^2$ on a dry basis.

If the silver halide emulsions of the present invention are used, printing plates can be produced after image-wise exposure simply by a development step and a washing-out step.

The presensitized printing plate of this invention can be appropriately exposed using various techniques, e.g., contact exposure, enlarging exposure, etc., using light from light sources such as a tungsten lamp, a xenon lamp, using electron beam irradiation, etc. A suitable exposure time can range from about $10^{-5}$ second (flash exposure) to about 100 seconds. A preferred exposure is an enlarging exposure using light from a tungsten lamp or a xenon lamp. A particularly preferred exposure time is 1 to 10 seconds or $10^{-5}$ second of flash exposure to light from a xenon lamp.

Surprisingly, it has been further found that the fogging development used in the present invention not only provides positive images where the highlight can be well removed but also accelerates tanning by a fogging precursor if such is copresent.

By using the combination of a specific type of silver halide emulsion and a specific type of developing solution, fogging occurs at the non-exposed areas. Development is prevented only at exposed areas where a latent image is formed whereby the non-exposed areas remain. Thus, a direct positive image is obtained. Fogging development is used to obtain such a direct positive image.

The presensitized printing plate of the present invention is, after image-wise exposure to light, tanning developed in the presence of a fogging agent and then a washing-off step is employed thereby to produce a printing plate.

A printing plate can be obtained by image-wise exposing to light the presensitized printing plate of the present invention, developing the image-wise exposed plate with a tanning developing solution containing a fogging agent, followed by a washing-off step. In another embodiment, a printing plate can be obtained by processing an image-wise exposed presensitized printing plate of the invention in which a fogging agent and a tanning developing agent were previously incorporated in the silver halide emulsion layer with an alkaline aqueous solution, followed by a washing-off step. Further, a printing plate can be obtained by developing an image-wise exposed presensitized printing plate of this invention with a tanning developing solution, followed by a washing-off step in which a fogging agent was previously incorporated in the silver halide emulsion layer. Furthermore, a printing plate can be also obtained by processing with an alkaline aqueous solution containing a fogging agent the presensitized printing plate of this invention, followed by a washing-off step, in which a tanning developing agent was previously incorporated in the silver halide emulsion layer. As a matter of course, a fogging agent and/or a tanning developing agent may be incorporated in both the silver halide emulsion layer and the processing solution.

The alkaline aqueous solution which can be used for development has a pH of about 9.5 to about 13.0, preferably 10.5 to 12.3. The alkaline aqueous solution is preferably an aqueous solution of sodium carbonate, sodium phosphate, sodium hydroxide, potassium hydroxide or a mixture thereof. Further, an organic solvent such as methanol, ethanol and benzyl alcohol may be added to the aqueous solution.

In the above, for producing a printing plate, a presensitized printing plate which contains a fogging agent and a tanning developing agent in the silver halide emulsion layer thereof is particularly preferred.

Examples of fogging agents or fogging agent precursors which can be used for fogging development are those described in, for example, U.S. Pat. Nos. 2,588,982, 3,227,552, 3,615,615, 3,719,494 and 3,734,738. Specific examples of such compounds include 2-methyl-3-[3-(p-sulfophenylhydrazono)-propyl]benzothiazolium bromide, 2-methyl-3-($\beta$-hydroxyethyl)-benzothiazolium bromide, p-methanesulfonamidoethylphenylhydrazine and 1,2-dihydro-3-methyl-4-phenylpyrido(2,1-b)-benzothiazolium bromide, etc. It is particularly preferred to incorporate a fogging agent precursor such as 3(2-acetylethyl)-2-benzylbenzoselenazolium bromide in the light-sensitive layer. A suitable amount of the fogging agent or the fogging agent precursor ranges from about 0.01 to 10 millimol per mol of the silver halide.

The tanning development used in the present invention is described in C.E.K. Mees, *The Theory of the Photographic Process*, Rev. Ed., pages 580–584, Macmillan Co., New York (1963), in which a hardening reaction is caused by image-wise exposure. A chemical structural feature of the developing agents is that they are benzenes or derivatives thereof in which each contains at least one hydroxy group and preferably, polyhydroxybenzenes substituted with halogen atoms such as chlorine, bromine, iodine or fluorine; aryl groups; amino groups; alkyl groups having 1 to 6 carbon atoms or substituted alkyl groups; or/and alkoxy groups. Suitable tanning developing agents which can be used include hydroquinone and derivatives thereof, catechol and derivatives thereof, resorcinol and derivatives thereof, and pyrogallol and derivatives thereof, etc. Particularly, catechol, resorcinol and pyrogallol substituted or unsubstituted with halogen atoms (bromine, fluorine or chlorine, etc.), aryl groups, amino groups, alkyl groups having 1 to 6 carbon atoms, substituted alkyl groups or alkoxy groups can be suitably used. Specific examples of these compounds include 4-phenylcatechol, pyrogallol and hyroquinone, etc. They may be incorporated in the light-sensitive layer. Tanning development can be suitably conducted at about 27° to about 40° C. Subsequent to the tanning development the unexposed areas are simply washed out with warm water at a temperature of higher than about 35° C. to produce an image.

The printing plates carrying relief images obtained using the presensitized printing plates of the present invention may be subjected further to a heat treatment such as by heating to about 200° C. for about 1 minute, irradiation with electromagnetic radiation such as ultraviolet light or infrared light, etc., or hardening treatment such as by immersion in a solution of chrome alum or epoxy compounds and drying with heat, by which the film strength of the images can be improved.

In the presensitized printing plates of the present invention, a subbing layer or a protective layer may be provided on the support in addition to the light-sensitive layer according to descriptions in, for example, Japanese patent applications 71845/76 (corresponding to U.S. patent application Ser. No. 807,617, filed June 17, 1977) and 71846/76 (corresponding to U.S. patent application Ser. No. 807,612, filed June 17, 1977). Suitable examples of subbing layers are those of hydrophilic polymers such as gelatin, gelatin derivatives, polyvinyl alcohol, polyvinyl pyrrolidone, polyvinyl imidazole, preferably those of tanning-developable hydrophilic polymers having a primary amino group.

Examples of the present invention are illustrated below. However, the present invention is not to be construed as being limited thereto. Unless otherwise indicated, all parts, percents, ratios and the like are by weight.

EXAMPLE 1

A 5% by weight aqueous solution of sodium tertiary phosphate was heated to 70° C. A 2S aluminum sheet having a thickness of 0.24 mm was immersed in this solution for 1 minute to degrease the sheet. An alternating current (60 Hz) of about 10 volts was passed through the sheet in a solution of hydrochloric acid of a concentration of about 1% at room temperature (about 20°–30° C.) for about 20 minutes to roughen the surface. After anodic oxidation was carried out in an aqueous solution of 20% by weight sulfuric acid at a direct current density of 1 amp/dm$^2$ for 5 minutes, the sheet was washed with water and dried. Gelatin was applied to the sheet to provide a coating layer of 0.2 g/m$^2$. A light-sensitive layer in a coating amount of 3 g/m$^2$ was then provided using a light-sensitive composition having the following composition.

| | |
|---|---|
| Silver Iodobromide Raw Emulsion (containing 45 g of gelatin per kg of emulsion and 0.59 mol of silver iodobromide containing 2 mol % silver iodide; average grain size: 1.2 $\mu$) | 500 g |

| | | |
|---|---|---|
| Gelatin (10% aq. soln.) | 275 | g |
| Potassium Iodide (0.5% sq. soln.) | 20 | ml |
| Water | 1,220 | g |

0.8 g of a polymerization product prepared from 1 mol of 4,4'-methylenediphenylisocyanate and 2 mols of hydroxyethylacrylate and 1 g of a polymer having the repeated unit

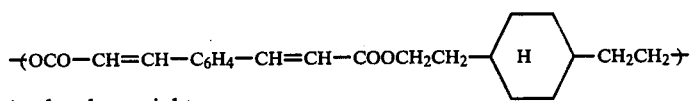

(molecular weight: about 10,000) were dissolved in a solvent mixture composed of 12 ml of ethylene chloride and 8 ml of methoxyethyl acetate. The solution was applied so as to form a protective layer in a coating amount of $0.2$ g/m$^2$ after drying.

After image-wise exposure to light, the thus-produced presensitized plate was developed at 20° C. for 120 seconds using the following developing solution, washed out using water at 45° C. and dried to obtain a positive relief image wherein the highlight was removed.

| Tanning Developing Solution | | |
|---|---|---|
| Pyrogallol | 3 | g |
| Metol (p-methylaminophenol sulfate) | 1 | g |
| Sodium Carbonate (anhydrous) | 112.5 | g |
| Potassium Bromide | 1.5 | g |
| Citric Acid | 1.0 | g |
| Sodium Polymetaphosphate | 1.0 | g |
| p-Tolyhydrazine | 0.1 | g |
| 5-Nitrobenzotriazole | 0.02 | g |
| Water to make | 1,000 | ml |

Using the resulting plate, 20,000 sheets of paper were printed by means of a printing machine Hamada-Star 500CD (trade name produced by Hamada Insatsuki Seizosho), using an ink, F Gloss 85 Black (trade name produced by Dai-Nippon Ink & Chemicals Inc.).

Further, the silver iodobromide emulsion used in this example was applied to cellulose triacetate film bases so as to form a layer having a thickness of $3\mu$. They were exposed image-wise to light under the same conditions as above described. One of them was developed at 20° C. for 6 minutes using Internal Developing Solution Y and the other was developed under the same conditions using Surface Developing Solution X, which were then fixed for 5 minutes. The $D_{max}$ obtained using Internal Developing Solution Y was 2.1, while the $D_{max}$ obtained using Surface Developing Solution X was 0.28. Accordingly, the silver iodobromide emulsion used was an internal latent image type emulsion.

EXAMPLE 2

A light-sensitive composition having the following formulation was applied to form a light-sensitive layer in a coating amount of about 3 g/m$^2$ after drying instead of the light-sensitive layer in Example 1. The others were the same as in Example 1.

| | | |
|---|---|---|
| Silver Iodobromide Raw Emulsion (the same as that described in Example 1) | 500 | g |
| Dispersion of Oleophilic Polymer and | 275 | g |
| Developing Agent (prepared as described below) | | |
| Potassium Iodide (0.5% sq. soln.) | 20 | ml |
| 2-Methyl-3-($\beta$-hydroxyethyl)benzothiazolium Bromide (2% aq. soln.) | 10 | ml |
| Water | 1,220 | g |

Process for Producing the Dispersion 10 g of a copolymer of 13% by weight of vinyl acetate, 86% by weight of vinyl chloride and 1% by weight of maleic acid anhydride, 10 g of 4-phenyl-catechol, 10 g of tricresyl phosphate and 40 ml of ethyl acetate were mixed to produce a solution. This solution was added to 250 g of an aqueous solution of 10% by weight of gelatin to which 10 ml of a solution of 10% by weight of sodium nonylbenzenesulfonate was added, and the mixture was dispersed using a high speed rotary mixer.

The development was carried out according to the method described in Example 1 using a developing solution having the following composition at 24° C. for 5 minutes after exposure to light.

| Tanning Developing Solution | | |
|---|---|---|
| Sodium Carbonate (anhydrous) | 112.5 | g |
| Potassium Bromide | 1.5 | g |
| Sodium Polymetaphosphate | 1 | g |
| Water to make | 1,000 | ml |
| | (pH: 11.8) | |

Further, washing out was carried out using water at 45° C. for 60 seconds to obtain a printing plate. 20,000 Sheets of paper were printed using this printing plate and an F-gloss type ink, produced by Toyo Ink Co., Ltd., using a printing machine, ROTAPRINT R40/K-30, trade name, produced by Rota Print Co.

While the invention has been described in detail and with reference to specific embodiments thereof, it will be apparent to one skilled in the art that various changes and modifications can be made therein without departing from the spirit and scope thereof.

What is claimed is:

1. A method of producing a lithographic printing plate which comprises (a) image-wise exposing to light a presensitized lithographic printing plate comprising an aluminum support having an anodically oxidized aluminum oxide film thereon and a light-sensitive layer of an internal latent image silver halide emulsion containing both a fogging agent or a precursor thereof and a tanning developing agent, (b) tanning developing said imagewise exposed printing plate with an aqueous alkaline solution and then (c) washing off said developed printing plate to remove the untanned area of said light-sensitive layer.

2. The method of claim 1, wherein said aluminum oxide film has a thickness of about 0.1 to about 50 microns.

3. The method of claim 1, wherein the silver halide in said silver halide emulsion has a particle size from about 0.1 micron to about 5 microns.

4. The method of claim 1, wherein the silver halide of said silver halide emulsion is silver chloride, silver bromide, silver iodide, or silver iodobromide.

5. The method of claim 1, wherein said fogging agent is 2-methyl-3-[3-(p-sulfophenylhydrazono)propyl]benzothiazolium bromide, 2-methyl-3-(β-hydroxyethyl)-benzothiazolium bromide, p-methane-sulfonamidoethylphenylhydrazine and 1,2-dihydro-3-methyl-4-phenylpyrido (2,1-b)benzothiazolium bromide, wherein said fogging agent precursor is 3-(2-acetylethyl)-2-benzylbenzo-selenazolium bromide and wherein developing agent is a hydroquinone, a catechol, a resorcinol or a pyrogallol.

6. The method of claim 1, wherein said aqueous alkaline solution has a pH of about 9.5 to about 13.0.

7. The method of claim 1, wherein said aqueous alkaline solution has a pH of 10.5 to 12.3.

8. The method of claim 7, wherein said aqueous solution is an aqueous solution of sodium carbonate, sodium phosphate, sodium hydroxide, potassium hydroxide or a mixture thereof.

9. The method of claim 1, wherein said fogging agent or said precursor is incorporated in an amount from about 0.01 to 10 millimol per mol of the silver halide.

10. The method of claim 5, wherein said fogging agent or said precursor is incorporated in an amount from about 0.01 to 10 millimol per mol of the silver halide.

11. The method of claim 7, wherein said tanning development is conducted at a temperature of about 27° to about 40° C.

12. The method of claim 1, wherein washing off is carried out with a warm water at a temperature of higher than about 35° C.

13. The method of claim 1, further including heating said washed off plate to strengthen said tanned light-sensitive layer.

14. The method of claim 13, wherein said heating is conducted under the condition of about 200° C. for about 1 minute.

15. The method of claim 1, further including irradiating said washed off plate with electro-magnetic radiation to strengthen said tanned light-sensitive layer.

16. The method of claim 15, wherein said electro-magnetic radiation is ultraviolet light or infrared light.

17. The method of claim 1, further including subjecting said washed off plate to a hardening treatment to strengthen said tanned light-sensitive layer.

18. The method of claim 1, wherein said hardening treatment is conducted by immersion in a solution of chrome alum or an epoxy compound followed by drying with heat.

19. The method of claim 1, wherein said presensitized lithographic printing plate has a subbing layer between said aluminum oxide film and said light-sensitive layer.

20. The method of claim 19, wherein said subbing layer is a layer of gelatin, a gelatin derivative, polyvinyl alcohol, polyvinyl pyrrolidone or polyvinylimidazole.

21. The method of claim 1, wherein said presensitized printing plate has a protective layer on said light-sensitive layer.

22. The method of claim 21, wherein said protective layer is a layer comprising a polymerization product prepared from 1 mol of 4,4'-methylenediphenylisocyanate and 2 mols of hydroxyethyl acrylate and a polymer having the repeated unit

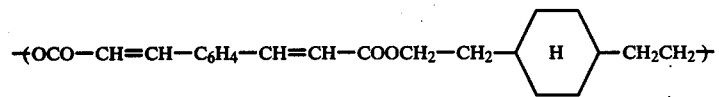

and having a molecular weight of about 10,000.

23. The method of claim 1, wherein said aqueous alkaline solution has the following composition:

| | | |
|---|---|---|
| Sodium Carbonate (anhydrous) | 112.5 | g |
| Potassium Bromide | 1.5 | g |
| Sodium Polymethaphosphate | 1 | g |
| Water to make | 1,000 | ml |

* * * * *